United States Patent [19]

Hanashey

[11] 4,023,097
[45] May 10, 1977

[54] NOISE AND DIELECTRIC ABSORPTION COMPENSATION CIRCUIT

[75] Inventor: Richard Emil Hanashey, Tustin, Calif.

[73] Assignee: Datatron, Inc., Santa Ana, Calif.

[22] Filed: Nov. 21, 1975

[21] Appl. No.: 634,025

[52] U.S. Cl. .............................. 324/73 R; 328/162; 330/149; 325/475
[51] Int. Cl.² .................... G01R 15/12; H03B 1/00
[58] Field of Search ........ 324/73 R, 73 AT, 73 PC; 235/153; 340/347 CC; 328/162, 163, 165; 330/149; 325/65, 475, 476

[56] References Cited

UNITED STATES PATENTS

| | | | |
|---|---|---|---|
| 3,525,052 | 8/1970 | Clark | 330/149 |
| 3,605,012 | 9/1971 | Kubanoff | 324/78 F |
| 3,718,910 | 2/1973 | Scray, Jr. et al. | 340/172.5 |
| 3,781,869 | 12/1973 | Sudnick et al. | 340/347 CC |
| 3,825,854 | 7/1974 | Pichal | 330/149 |
| 3,906,384 | 9/1975 | Schiffman | 328/165 |
| 3,936,759 | 2/1976 | Macheel | 328/162 |

Primary Examiner—Rudolph V. Rolinec
Assistant Examiner—Vicent J. Sunderdick
Attorney, Agent, or Firm—George Frazier Bethel; Patience K. Bethel

[57] ABSTRACT

The following specification discloses a current noise and dielectric absorption kickback compensation circuit for a force line and a sense line that are to be initially compensated with regard to unwanted currents therein. The lines are placed in a shielded cable and mutually receive the same external noise signals. The unwanted currents are incurred in the force line and the sense line which is connected to a device under test, such as an integrated circuit, that is to have a particular voltage forced thereon and a determination made or sensed as to the current drain thereof. The force and sense lines can be initially connected to a tester which is controlled by a computer. The lines lead to the device under test through various lines interconnected by relay matrices which provide a number of different functions for testing the device under test, such as timed events, voltages, and external active or passive elements used cooperatively with the device under test and the other pins thereof. The invention compensates for spurious signals which are mutually incurred on the force and sense lines through dielectric absorption kickback and noise generated thereon, such as sixty cycle ambient noise. The compensation is effectuated by the sense line being clear of any driven signals thereon. This allows the provision of any spurious currents thereon to an amplifier having a zero reference point. The foregoing amplifier of the sense line has its output connected to an inverted reference of the input of a force line amplifier. This places the spurious respective currents on the force and sense lines in diametrically opposed equal values for purposes of providing a null on the two respective lines, inasmuch as they both receive the same approximate dielectric and noise factors. The nulling effect compensates for noise, and dielectric absorption kickback that is caused by the switching matrices and the ambient noise, so that a true current reading on the force line can take place as to any current thereon that relates to the device under test.

14 Claims, 2 Drawing Figures

NOISE AND DIELECTRIC ABSORPTION COMPENSATION CIRCUIT

BACKGROUND OF THE INVENTION

1. Field of the Invention

The field of this invention lies within the electronic art as it relates to the compensation of spurious signals on two relatively adjacent lines. More specifically, it relates to the utilization of a sense and a force line within a system in which the current in the sense line is to be read accurately and all spurious signals are to be nulled on the force and the sense line. It can be particularly applied to the solid state testing art as it relates to testers having lines connected to a device under test, such as an integrated circuit in which a voltage is to be forced and a current sensed therefrom.

2. The Prior Art

The prior art with regard to compensating for spurious signals in electronic lines has generally applied cross circuit connections, common modes, and certain regenerative types of compensation to avoid the incursion of spurious signals that might interfere with the desired signals on the lines.

Recently, it has been common to test various integrated circuits by means of an electronic tester. The tester is often controlled in part by a computer. The tester generates a signal that is provided to an integrated circuit, hereinafter referred to interchangeably as a device under test. The signal which oftentimes is a forced voltage or current, is provided to the device under test by various supply means that must be connected to the device through a switching network in the form of relays.

The connection lines tend to pick up spurious ambient signals, as well as a degree of dielectric absorption kickback when there are certain changes in voltage. The dielectric absorption kickback can be generated by changes of voltage either through switching of the relays, or changes in voltage dictated by the computer and provided by the tester.

The minimum requirements of a system for testing certain devices with a force and a sense line, is such that the entire system must be accurate on a static as well as a dynamic basis.

The prior art has not specifically solved the problem of currents generated by dielectic absorption kickback and spurious signals on adjacent lines by elimination thereof through shifting from a normal mode to a common mode. However, the inventor has found that the utilization of this principle at the current values on the force line with respect to its IR drop, enables the utilization of a common mode. In other words, the sense line can be placed in a position where it is free. Inasmuch as it runs along the same path as the force line, it normally picks up the same spurious current signals as the force line, so that it can be used to compensate for the spurious current signals within the system.

To effectuate the foregoing, the inputs are reversed so that a signal is generated 180° out of phase with respect to the sense line and the force line. The force line and the sense line spurious current signals, by way of sixty cycle noise, other signal noises and dielectric absorption kickback, are nulled by the foregoing means. Stated another way, the output of an amplifier on the sense line is fed as the reference voltage to a current amplifier of the force line. The net result is that the inversion of the signal on the sense line when fed to the force line, nulls out the signals on the force line that have been spuriously created.

In effect, this invention provides an advance over the prior art by enabling a nulling of spurious current signals on a force and a sense line, or for that matter, all lines in adjacent relationship to each other. In particular, it is useful with regard to devices under test that are to be tested on a tester, wherein the forced voltages are transmitted and currents sensed from a remote location from the device under test.

SUMMARY OF THE INVENTION

In summation, this invention comprises a new circuit for nulling and compensations dielectric absorption kickback, 60 cycle noise, and other noise on two lines in adjacent relationship to each other.

More particularly, it involves the utilization of a compensating circuit within two lines that are to be respectively utilized for forcing a signal to a device under test, and sensing the signal current therefrom. The force line can provide a given voltage and the sense line determines the unwanted current from the device under test with respect to the signal that has been provided to it.

The force and sense lines are generally located within a cable connected to a tester which is in turn controlled by a computer. The force and sense lines within the cable are connected through a switch matrix to a device under test either in adjacent relationship to certain circuits or elements that are switched in and out for other testing functions. The force and sense lines in their adjacent relationship have a common exposure to spurious current signals such as those created by dielectric absorption kickback and 60 cycle ambient noise. However, inasmuch as the force line to the device under test has relatively little or no IR drop due to low current situations, there is no voltage differential. As a consequence, the sense line of the device under test can be used to compensate the force line. This is fundamentally due to the IR drop being insignificant and not degrading due to the voltage from the device under test. In other words, the sense line has fundamentally the same unwanted currents analogous to those on the force line, and one can be used to null the other.

BRIEF DESCRIPTION OF THE DRAWINGS

The invention will be more clearly understood by reference to the description below taken in conjunction with the accompanying drawings wherein.

DESCRIPTION OF THE PREFERRED EMBODIMENTS

The Apparatus and Circuit

Figure 2:
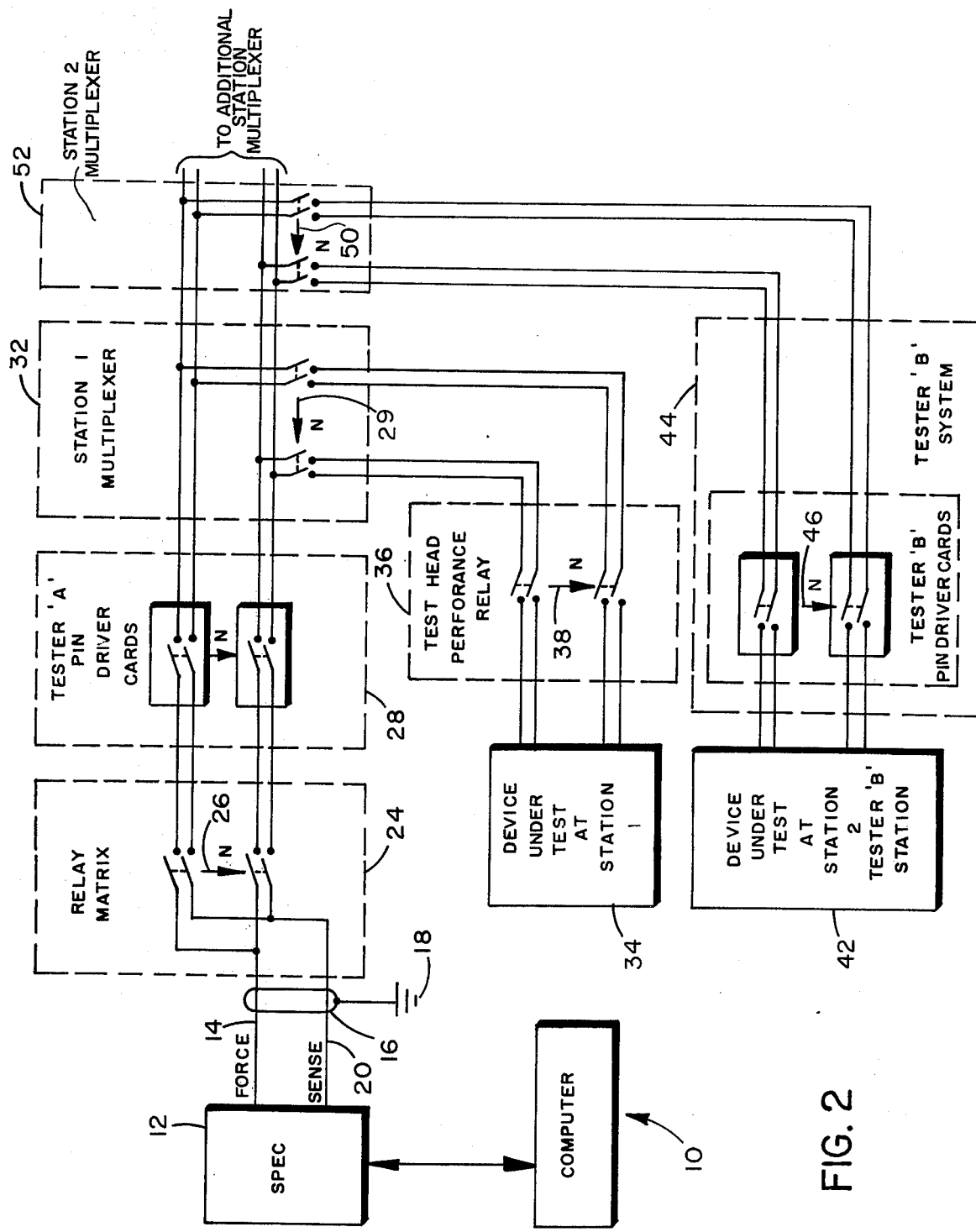

Looking more particularly at FIG. 2, the entire system in which the circuit is used can be seen. The system is generally oriented for purposes of testing an integrated circuit.

By way of background, integrated circuits such as those now produced in various dual in line packages, have a number of pins or terminals. Various functions within the integrated circuits can be performed by utilizing any number of the pins. Such functions relate to transistorized switching, oscillatory functions, digital counting functions, as well as complete electronic functions that are normally provided by a series of discrete circuits.

The different functions of the circuit have to meet certain criteria to be operative. For instance, certain pins provide bias voltages as well as other support functions to the discrete components within the circuit. Additionally, other portions of the integrated circuits provide the active functions for the entire circuit.

As a consequence of the foregoing, the integrated circuits referred in part hereinafter as the devices under test ( DUT), oftentimes have to be tested in order to determine their performance. As an aside, in the manufacture of integrated circuits, different deposition of layered materials shift during production over an extended period of time. This creates a situation wherein the quality of high production quantities is not as high as it should be. For example, high quality yield in certain integrated circuits is comparitively low because of high quality production. As a consequence, there is a range within which certain integrated circuits are capable of being used on a reliable basis. It is often more desirable to have a high quantitative yield with low quality and then segregate the high quality items from the entire batch of integrated circuits that have been manufactured.

In the foregoing function, the manufacturer of integrated circuits will oftentimes test the integrated circuits to ascertain the quality thereof. Furthermore, the end user of the manufactured items incorporating the integrated circuits, oftentimes wants to ascertain the quality of the circuits prior to connecting them within the entire manufactured devices. This avoids failure within the entire device after assembly, which can be very costly.

To perform the foregoing tests, integrated circuit testers provide certain forced per-established ranges of voltages and currents and a determination is made as to the quality of the integrated circuits that are to be used.

The showing of FIG. 2 is exemplary of a device for the testing of such integrated circuits. The tests that are to be performed and the interrogation related to the results of the tests, can generally be provided by a computer 10. The computer 10 can have a pre-established memory incorporated therewith for purposes of providing a test to an integrated circuit that has had pre-established functional ranges either from a manufacturer's point of view or the end product user's point of view.

The computer in this particular instance controls a forcing and measurement sequential mode module (MOD) 12. The module 12 referred to in part hereinafter as a MOD, provides a number of forced voltages and currents on a timed and/or sequential basis to the device under test at a remote location. In other words, the MOD can provide a pre-established forced voltage when a certain amount of current drain is to be ascertained, or perhaps with a certain amount of current forced thereon, when the voltage is to be ascertained. In providing the foregoing currents and voltages, the MOD must maintain substantial accuracy in the value of the voltages and currents that are to be provided to the lines. In the given instance, the MOD 12 delivers a voltage or current to a force line 14 that has been placed in a cable such as a shielded cable 16 having a ground 18. The shielded cable 16 also incorporates a sense line 20 along with the force line 14. The force line 14 delivers the respective current or voltage to the device under test while the sense line determines the character of the voltage or current from the device under test.

It is common to test a number of devices at a multiple number of stations because of the requirement for extremely high numbers of devices to be tested. The ability to mechanically locate the devices under test does not meet the speed level of the tester through its computer. Consequently, a relay matrix 24 has been provided having numbers of different relays 26. The different relays 26 interconnect a number of different stations wherein a device under test can be mechanically positioned for test.

A first tester 28, namely tester A, is incorporated within the different relay configurations to receive signals from a number of devices under test at various stations. Tester A has pin driver cards and is connected to the first relay matrix so that a switching function can take place between any number of pins in the device under test. Other pins within the device under test oftentimes need a particular input or load in order to provide the total function of the integrated circuit. As a consequence, the pin card driver 28 drives the other respective pins that are not under test within the device under test. For instance, a particular voltage might be applied to the other pins not under test for purposes of providing a voltage for the interfacial functional characteristics of the pin with respect to the other pins in the device under test.

It should be understood that each device under test is at a respective station. Looking at one particular station, namely Station 1 connected to the Station 1 multiplexer, it can be seen that N relays 29 have been connected to multiplex between N stations, including Station 1. Each particular test station receives all the forced voltages that are to be applied thereto and connects them to a particular device under test, namely the device under test at Station 1, designated 34.

The test head performance relay 26 provides various resistors and capacitive elements to create a given electronic environment to a device under test, such as that at Station 1. In other words, the device under test at Station 1, labeled 34, is connected to the test head performance relay 36 to provide the electronic functions to the pins for the proper end result to determine the electronic characteristics of the device under test. The test head performance relay 36 has N number of different relays 38 which enable a multitude of electronic functional elements to be incorporated within the test.

Looking at Station 2, labeled 42, a second device under test is incorporated within a second tester 44, labeled tester B. Tester B and N numbered relays 46 which provide the analogous functions of test head performance relays 38. In other words, it provides other more complicated functions with regard to a second device under test and can provide test for the second device under test at different speeds and other levels. In order to provide a multiplicity of tests, the device under test at Station B, is multiplexed through a series of N numbered relays 50 within a multiplexer 52.

All of the foregoing are connected through the MOD 12 by means of force and sense lines 14 and 20. As can be seen, a large amount of activity takes place through the respective force and sense lines 14 and 20 because of the plurality of relays and test functions that are going on continually. As a consequence, the dynamic characteristics of the noise on the lines causes by sixty cycle ambient noise, as well as the dielectric absorption kickback is substantial.

As can be seen from the foregoing relay matrices, lines and devices which the force and sense lines 14 and 20 respectively have to be connected to, a substantial amount of noise and dielectric absorption kickback is incorporated within the system. Thus, the force and sense lines 14 and 20 respectively should incorporate various means enabling the device to provide a truly accurate reading. The integrated circuits that are under test require extreme accuracy because of the nature of the voltages and currents that are incorporated within the systems they serve. Thus, the accuracy requirements of the force and sense lines 14 and 20 in the circuit require a corresponding degree of nullification with regard to spurious, transient, and other signals.

Figure 1:
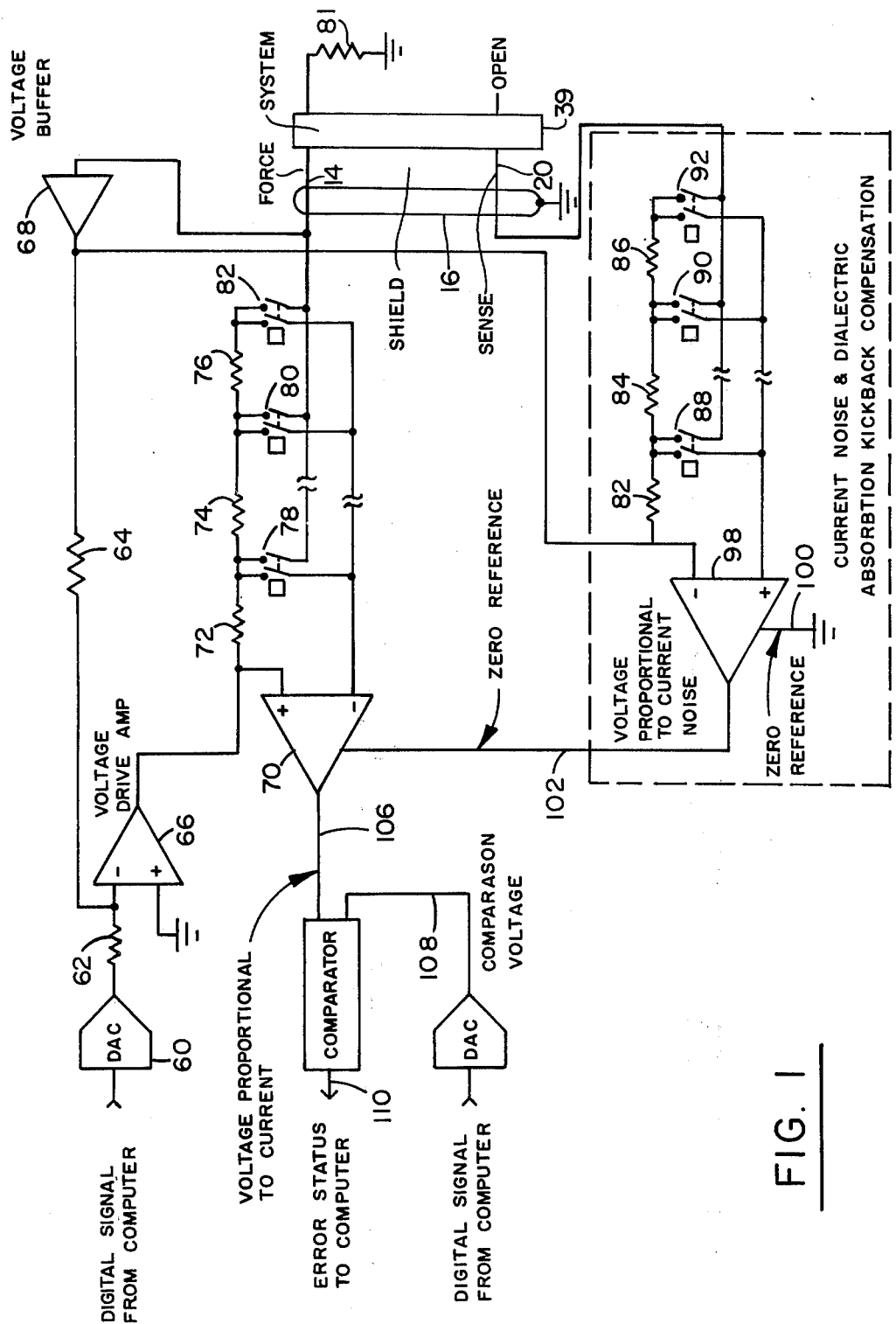
FIG. 1 shows the circuit of this invention on a schematic basis with the sense line and the force line being connected in a simplified system; and, FIG. 2 shows a system in which the circuit in FIG. 1 can be utilized.

Looking more particularly at FIG. 1, it can be seen wherein the circuit of this invention has been detailed in a manner whereby it is integrated within the system of FIG. 2. The circuit is incorporated with the force and the sense lines whereby a digital signal from the computer 10 is received at a digital to analog converter 60. The digital signals from the computer 10 relate to the specifically required signals that are to be imposed on the device under test. This digital signal that is converted to an analog signal for the device under test is imposed as an analog voltage at the input of the voltage drive or amplifier 66. An input resistor 62 is shown prior to the terminal connection that in turn is connected to a feedback resistor 64. Current in the resistor 64 is provided by a voltage amplifier rather than the line in order to buffer the line. Thus, there is no current drain imposed by the feedback resistor.

The current in the feedback resistor 64 is provided by the amplifier 66 and is buffered by a voltage buffer 68. In this manner, the line is buffered and the feedback resistor 64, as mentioned, does not impose any current drain.

A differential amplifier 70 is shown. The current provided by the differential amplifier 70 measures the IR drop across the resistors which are pulling down the voltage. In order to change the current measurement ranges, a change in resistance by varying the number of resistors 72, 74 and 76, is provided by the respective relays 78, 80 and 82. These serve to vary the resistance in a manner whereby the resistors can be switched in and out to enable a range of readings with regard to the device under test.

Looking more particularly at the force line and sense line relationship, it is seen that they are placed in the shielded cable 16. The system which was previously described in FIG. 2 is that system 39 connected to the force line and sense line, and labeled system, which comprises FIG. 2. The device under test at a specific station has been shown as a load or resistance 81.

The sense line 20 connected through the shielded cable 16, returns through a like series of resistors as resistors 72, 74 and 76, which have been labeled 82, 84 and 86. These resistors are in like manner connected respectively to relays 88, 90 and 92.

The sense line amplifier, namely amplifier 98, is placed at a ground or zero reference at ground 100. This enables a zero reference to be implaced on line 102 connected to the input of the force line amplifier. The connection tends to nullify the output of the force line by being 180° out of phase, or by having a completely opposite polarity, but being of the same given value as the unwanted current on the force line.

The output on the force line, namely the output on line 106, is connected to a comparator and interrogated by a comparison voltage on line 108 connected thereto. The comparison voltage on line 108 is provided as an analog voltage for comparison purposes at the comparator and presents the computer with an error status at connnection 110. The error status to the computer is then registered and utilized in any particular form to determine whether or not the device under test is within or outside of the parameters required for proper functioning qualitatively of the device under test. The end result is that the device under test is either rejected or accepted.

OPERATION OF THE INVENTION

One of the general problems of testing integrated circuits on most testers reside in ambient sixty cycle noise being on the sense line and the force line. Furthermore, dielectric absorption kickback with regard to changes in voltages causes spurious signals, thereby presenting inaccurate measurements. Additionally, there is an exponential factor related to the dielectric absorption kickback due to the opening and closing of relays from the high to the relatively quiescent condition. Also, the distance of measurement from the device under test to the tester causes the force and sense lines to pick up substantially various spurious signals. However, the signals which the force and the sense lines pick up in the shielded cables 16, namely lines 14 and 20, are generally analogous between each line. In other words, the dielectric kickback and the sixty cycle ambient noise and other noise generally affect both lines in the same manner, inasmuch as they are side by side.

The current within the force line 14 is relatively insignificant in the line, thus the voltage is relatively constant due to the lack of IR drop. As a consequence, the IR drop in the measurements that are being taken, does not have to be compensated for. Therefore, the sense line 20 returning from the device under test can be used as a compensating type of line to function with the force line 14. This is due to the fact that it has been placed freely within the system. As a consequence, any spurious currents on the sense line 20 should be analogous to those on the force line, and can be used to null the currents thereon.

In the given case, the force line 14 has a given load of interest and a given value being looked for. The dielectric absorption kickback or other spurious signals such as sixty cycle noise on the two respective lines creates a current on the force line as well as the sense line. Thus, the difference between the two should be zero, thereby allowing one, namely the sense line spurious current, to be subtracted from the force line spurious current, providing a nulling effect. In essence, only the DC level of the current of the device under test is seen.

The two respective lines, namely the force line 14 and the sense line 20, both respond dynamically with respect to any signals thereon. This is important inasmuch as the changes in voltage are quite rapid. Thus, the nulling effect is on a dynamic basis with regard to the subtraction of one value on one line from the other.

In looking at the operation of the amplifier 98 with respect to the amplifiers 70, it can be seen that the current reading under a forced voltage situation to the device under test, namely the device shown as resistor 81, is such that the sense line amplifier is at ground. The reference to the force line amplifier is the output of the sense line amplifier. Thus, what has happened is an inversion of the output of the sense line in order to nullify the output of the force line. The end result is a true current output created by a driven voltage on the force line due to the fact that the output from the force line amplifier is completely compensated for by the output from the sense line amplifier.

As can be seen from the foregoing specification, this invention is to be read broadly in light of the prior art so that the claims generally cover compensation of force lines and sense lines within close proximity to each other, or similar lines having signals connected through a general Kelvin type of connection that should be monitored, whether they be for test purposes as in the given specification or other purposes, wherein a signal is to be applied and then sensed respectively on two lines.

I claim:

1. A circuit to compensate for spurious signals such as current noise and dielectric absorption kickback generated through voltage changes within a pair of lines mutually connected to a load that is to be tested as to its response to certain signals impressed thereon comprising:
   a first force line connected to said load under test upon which a signal is impressed;
   a second sense line upon which a signal is to be sensed in the form of a current emanating from said load;
   a first operational amplifier having a connection to the force line; and,
   a second operational amplifier for receiving the current from the sense line and having a zero reference point, with an output connected to the reference of the first amplifier and opposite from the input of said first operational amplifier in order to null any spurious signals on the two respective lines to provide an output directly proportional to the current on the sense line from the load.

2. The circuit as claimed in claim 1 wherein:
   The first line and said sense line are within a shielded cable to effectuate a similar electrical environment.

3. The circuit as claimed in claim 2 wherein:
   said shielded cable is connected to ground.

4. The circuit as claimed in claim 3 further comprising:
   means for receiving given analog signals;
   a voltage drive amplifier connected to said means and to the input terminal of said first operational amplifier; and,
   a voltage buffer amplifier placed within the first line.

5. The circuit as claimed in claim 1 further comprising:
   a comparator connected to the output of said first operational amplifier and to a signal source that is to provide a comparison voltage to provide an output that is the error status between the comparison voltage and the output of said first operational amplifier.

6. The circuit as claimed in claim 5 further comprising:
   an integrated circuit tester connected to the first line which is a force line and to said sense line wherein said force and sense lines are adapted for connection to an integrated circuit for comparing the respective currents flowing therefrom after a voltage has been forced thereon.

7. The circuit as claimed in claim 6 further comprising:
   N number of stations adapted to receive an integrated circuit to be connected to the force and the sense lines respectively for test;
   a relay matrix interposed between the tester and the stations for purposes of switching the tester and the force and sense lines to the respective stations for testing a plurality of different integrated circuits; and,
   a forcing and measurement sequential mode circuit for providing driven voltages to the force line through the relay matrix.

8. A tester for testing devices such as integrated circuits wherein a given voltage is applied to a device under test and a determination is made as to the amount of current flowing therefrom wherein the improvement comprises:
   a force line adapted for connection to the device under test to impose or force the given voltage thereon;
   a sense line for sensing the unwanted amount of current from the device under test;
   a cable in which said force and sense lines are maintained;
   an electronic circuit means connected to said force line for providing a pre-established voltage thereon;
   N number of stations for receiving a device to be tested for adapted connection to the force and sense line;
   a relay matrix for connecting the circuit means for providing the voltage to the respective stations for testing the device to be tested;
   an operational amplifier connected to the force line having a given input and reference; and,
   a second operational amplifier connected to the sense line having an output and a zero reference, wherein the output is connected to the reference of the first operational amplifier so that spurious signals on the force and the sense line are nullified by the respective inputs being opposite from each other so that only the proper current that is flowing from the device under test is seen rather than any spurious currents and signals.

9. The circuit as claimed in claim 8 further comprising:
   a voltage drive amplifier connected to the input of said first operational amplifier; and,
   a voltage buffer connected between the force line and the reference of said first operational amplifier;

10. The tester as claimed in claim 9 further comprising:
    drivers for respective pins other than the particular pin that is to be provided with a forced voltage; and,
    relay means for connecting the drivers to the other respective pins.

11. The circuit as claimed in claim 10 further comprising:
    N number of relays for multiplexing different respective stations that are to be served by the respective force and sense lines.

12. The circuit as claimed in claim 10 further comprising:
    a forcing and measurement sequential mode circuit within said tester to provide a forced voltage on the force line and means to control the voltage provided thereby.

13. The tester as claimed in claim 12 wherein the control means for the driven voltage comprises:
   a computer; and,
   wherein a comparator is connected to the output of said first operational amplifier at its input and a means for generating a comparison voltage from said computer to provide an output from said comparator which relates to the error status between the input from the computer and the output from said first operational amplifier.

14. The circuit as claimed in claim 13 further comprising:
   a variable resistance within each one of the respective force and sense lines for providing various readings with respect to a device under test.

* * * * *